United States Patent [19]
Kirihata et al.

[11] Patent Number: 5,517,442
[45] Date of Patent: May 14, 1996

[54] RANDOM ACCESS MEMORY AND AN IMPROVED BUS ARRANGEMENT THEREFOR

[75] Inventors: Toshiaki Kirihata, Wappingers Falls; Yohji Watanabe, Fishkill, both of N.Y.; Hing Wong, Norwalk, Conn.

[73] Assignee: International Business Machines Corporation, Armonk, N.Y.

[21] Appl. No.: 402,790

[22] Filed: Mar. 13, 1995

[51] Int. Cl.⁶ .................................. G11C 7/00
[52] U.S. Cl. .................. 365/51; 365/63; 365/230.03
[58] Field of Search .................. 365/51, 63, 230.03, 365/200, 72

[56] References Cited

U.S. PATENT DOCUMENTS

| | | | |
|---|---|---|---|
| 4,660,174 | 4/1987 | Takemae | 365/63 |
| 4,701,885 | 10/1987 | McElroy | 365/51 |
| 4,796,224 | 1/1989 | Kawai | 365/51 |
| 5,142,492 | 8/1992 | Shimizu | 365/51 |
| 5,367,480 | 11/1994 | Matsumiya | 365/63 |

Primary Examiner—David C. Nelms
Assistant Examiner—Son Mai
Attorney, Agent, or Firm—Charles W. Peterson, Jr.

[57] ABSTRACT

The present invention is a bus arrangement for a wide I/O Random Access Memory (RAM). The bus arrangement includes a global address bus which drives row/column predecoders and redundancy comparators placed at each edge of the memory array. Two banks of sixteen data I/O (DQs), one bank for each half chip, are placed at either end of the chip providing up to a ×32 I/O organization. The main Read/Write Data lines (RWD) are more densely populated near the chip edge than the chip center to provide ×4 and ×8 options, as well. A local address bus is in the open space between the RWDs to redrive the global address lines at their quarter points.

11 Claims, 3 Drawing Sheets

RANDOM ACCESS MEMORY AND AN IMPROVED BUS ARRANGEMENT THEREFOR

RELATED APPLICATION

This application is related to application Ser. No. 08/403,265, to DeBrosse, et al., entitled "Exchangeable Hierarchical Data Line Structure", and to application Ser. No. 08/402,379, to Kato, et al., entitled "A Reduced Pitch Layout for a Semiconductor Memory Device", both assigned to the assignees of the present invention and filed coincident herewith and incorporated herein by reference.

FIELD OF THE INVENTION

The present invention relates generally to semiconductor memories and more particularly to bus arrangements for Dynamic Random Access Memories.

BACKGROUND OF THE INVENTION

The growing personal computer market is driving the demand for denser and denser Dynamic Random Access Memories (DRAM). Because high performance computers require wider and wider data buses, and because state of the art microprocessors typically employ a 32 bit or 64 bit data word, new generations of dense DRAMs are being organized with wide data paths of 32 bits (×32) or wider. A computer system using one of these microprocessors usually requires 4–8 MBytes (MB) of DRAM. 8 MB of memory for such a system, organized 2M by 32 can be made from four 16 Mb (2MX8) chips fairly simply. For example, a 2M by 32 Single In-line Memory Module (SIMM) would use 4 chips 2M by 8 in parallel. However, a 64 Mb chip organized 8M by 8 cannot be reconfigured so simply. Instead, a X32 SIMM organization from an 8M by 8 requires additional complex logic at a substantial loss in performance. However, a wide Input/Output (I/O) organization provides the optimum 64 Mb chip organization for use in a typical state of the art microprocessor based system, whether organized 2M by 32, 1M by 64 or 512K by 128. In fact, a 512k by 128 organization provides concurrent access to four 32 bit words simultaneously. Even as chip densities increase to 256 Mb and beyond, new wider word architectures, such as the Very Long Instruction Word (VLIW) architecture with instructions 256 bits wide or wider, are coming to the forefront.

Still another reason dense DRAM chips are tending toward a wide I/O DRAM organization is the performance requirement for DRAMs used by high performance microprocessors. Typical prior art DRAMs cannot meet this performance requirement. One state of the art approach to increasing Synchronous DRAM (SDRAM) throughput is known as "Prefetch". A Prefetch SDRAM has a wider on-chip data path than its off-chip I/O, e.g. 64 bit on-chip paths vs. 32 bit off-chip. All array (on-chip) operations occur simultaneously (i.e., 64 bit array reads and writes) with off chip transfers done sequentially, i.e. two 32 bit transfers. Consequently, because wide I/O RAMs simplify memory system design and improve RAM performance, wide I/O RAMs are needed.

However as the number of DRAM I/O increases, the number of chip pads and chip wiring between the DRAM circuits and from circuits to the pads must increase. Thus, chip size is also increased. In addition to the size of the main I/O bus, wiring RC delay in the peripheral circuits also becomes a concern in high density, wide I/O DRAMs. Still other timing problems such as address bus delay and timing skew become significant and are exacerbated further for DRAMs including redundancy.

FIG. 1 is a schematic representation of a DRAM chip 100 with a prior art single global bus 102 for addresses, I/O and External Chip Controls, e.g., RAS, CAS, SEL, etc. To reduce wiring RC delay with such a bus, the bus must be fragmented, adding, thereby, extra buffers (represented by arrow heads 104) and forming local busses 106. Since neither the global bus 102 nor the local buses 106 can share the same wiring channels with each other or, with the main Read/Write Data lines (RWD), not shown, this approach requires an even larger (wider) bus area. The RWD lines are lines between the memory units 108 and the off chip driver/receiver (DQ) at each Data pad 112. A wider bus means a wider chip and incurs significant wiring congestion from, for instance cross pad connections. A global bus of addresses and array control signals must be along the entire length of the chip to access the memory cells in every unit 108 of the memory chip 100.

This prior art structure is simple yet difficult to implement because it requires complicated wiring 110 across the pads 112. It is impossible to connect redundancy circuits (which number in the thousands) directly to such a bus. If the DRAM includes redundancy circuits, local buses are necessary. Thus, there are effectively three parallel address buses on this prior art chip.

Normally, the long global bus 102 has large RC delay, especially when redundancy circuits are attached directly to it. A 0.5 RC delay on such heavily loaded lines is larger than 1ns from center to edge. However, the RC delay can be reduced either by widening the mutual lines or by segmentation plus redrive, i.e., duplicated bus lines carry signals to the segment redrive circuits. Both of these approaches increase chip size. Therefore, a bus arrangement is needed that minimizes bus delay and skew is needed.

PURPOSES OF THE INVENTION

It is a purpose of the present invention to reduce semiconductor memory chip size.

It is another purpose of the present invention to reduce semiconductor memory wiring bus size.

It is yet another purpose of the present invention to reduce bus skew and delay.

It is yet another purpose of the present invention to reduce semiconductor memory wiring bus size, semiconductor memory chip size, bus skew and delay.

SUMMARY OF THE INVENTION

The present invention is a bus arrangement for a wide I/O Random Access Memory (RAM). The bus arrangement includes a global address bus which drives row/column predecoders and redundancy comparators placed at each edge of the memory array. Two banks of sixteen data I/O (DQs), one bank for each half chip, are placed at either end of the chip providing up to a 33 32 I/O organization. The main Read/Write Data lines (RWD) are more densely populated near the chip edge than the chip center to provide ×4 and ×8 options, as well. A local address bus is in the open space between the RWDs to redrive the global address lines at their quarter points.

TECHNICAL DESCRIPTION OF THE PREFERRED EMBODIMENT

The preferred embodiment of the present invention includes two main bus arrangements: 1) a Split global address/array control signal bus (global bus) shared by array control circuits and redundancy circuits; and, 2) a local address/control bus (local bus) parallel to global bus in wiring channels shared with read-write-data-lines (RWD lines). The first bus arrangement alleviates wiring congestion and the second reduces RC delay and skew.

Figure 1:
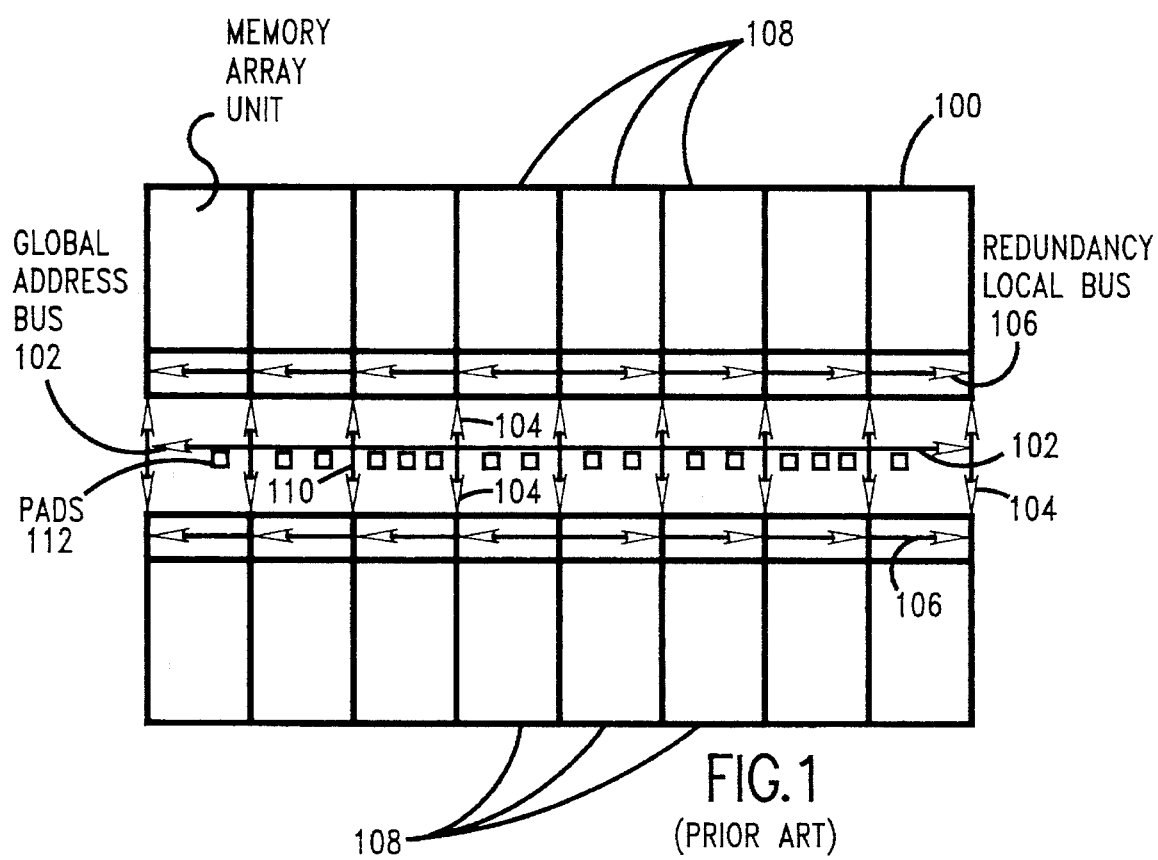
FIG. 1 is a schematic representation of a DRAM chip 100 with a prior art single global bus 102 for addresses, I/O and External Chip Controls.
Figure 2:
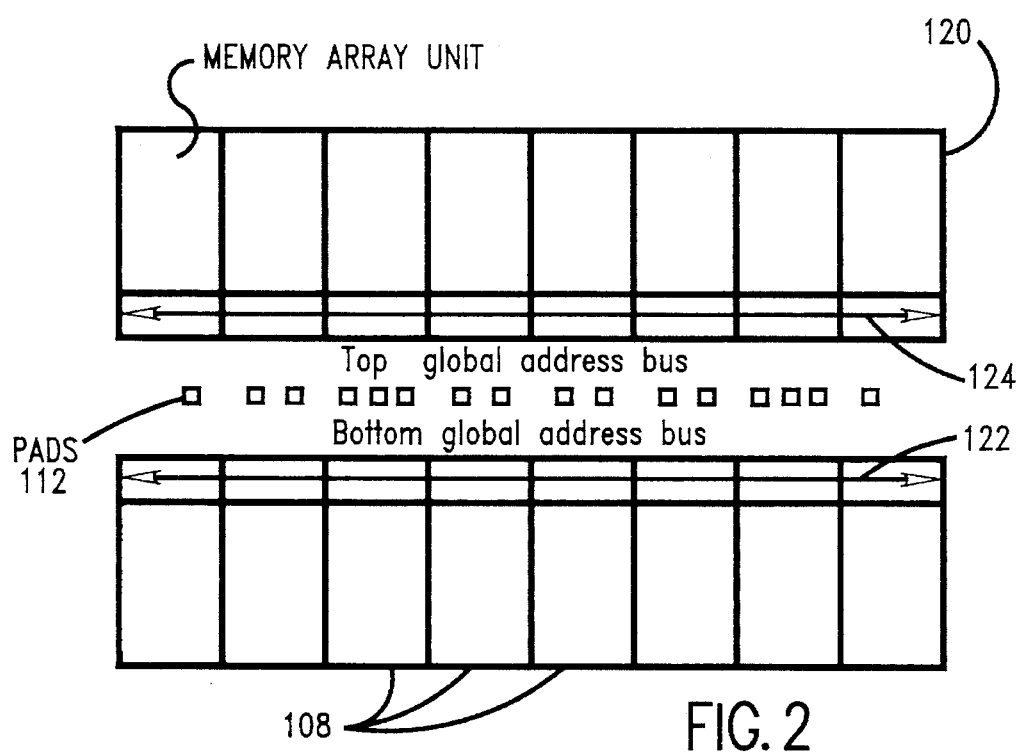
FIG. 2 is a schematic representation of a DRAM chip 120 including the general principle of the present invention.

FIG. 2 is a schematic representation of a DRAM chip 120 including the general principle of the present invention. A split global bus 122,124 is shared by array control and redundancy circuits. The global bus 122,124 is split into two buses placed on either side of the pads 112. The redundancy circuits (as described in application Ser. No. 08/346,965, to Kirihata, et al., entitled "A Random Access Memory Having A Flexible Array Redundancy Scheme", assigned to the assignees of the present invention and incorporated herein by reference) are directly connected to these two buses. Thus, each of these global busses 122,124 function as the redundancy local bus 106 and replace the single center bus 102 of the prior art, which is eliminated. By reducing the number of wires, this effectively removes the wiring congestion in the center.

Figure 3:
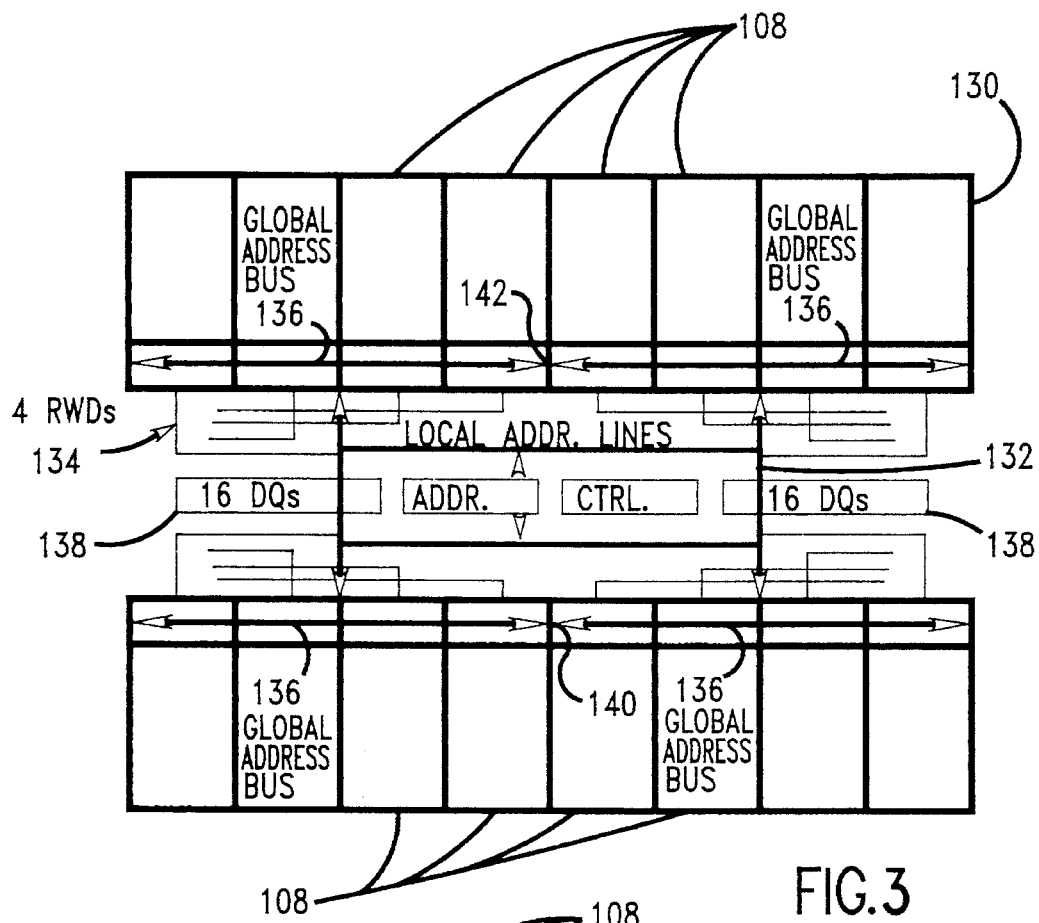
FIG. 3 is a schematic representation of a DRAM chip 130 including the preferred embodiment bus arrangement with local bus 132 sharing wiring channels in common with RWD lines 134.

FIG. 3 is a schematic representation of a DRAM chip 130 including the preferred embodiment bus arrangement with local bus 132 sharing wiring channels in common with RWD lines 134. The RWD lines 134 are placed more densely near the chip edge than in the chip center. It is possible to place the RWD lines 134 near both chip ends and use the open wiring channels near the chip center to form a local bus 132 between redrive circuits, wherein the locations are the quarter points. The RC is reduced, therefore, without using extra area.

A global address bus 136 is on each internal array quadrant edge. Each global address bus 136 drives row predecoders, column predecoders, and redundancy comparators. Sixteen DQs 138 are at each end of the chip 130. The left sixteen DQs 138 are dedicated to the left half memory units 108, while the right sixteen DQs 138 are dedicated to the right half. The RWD lines 134, therefore do not cross the chip. The DQ pin locations and RWD wiring are located such that RWD lines 134 (2×2×4=16 pairs) do not cross the center area of the chip, leaving those channels clear in the center for other uses. A local address bus 132 (14 wire pairs) is placed in the open channels in between the 2 quarter points 140,142, where redrive circuits both buffer and redrive the addresses to the global address buses 136. Since there are more open channels than address lines, the local address bus 132 does not increase chip area. The extra open channels are available for wiring other individual skew sensitive signals.

Figure 4:
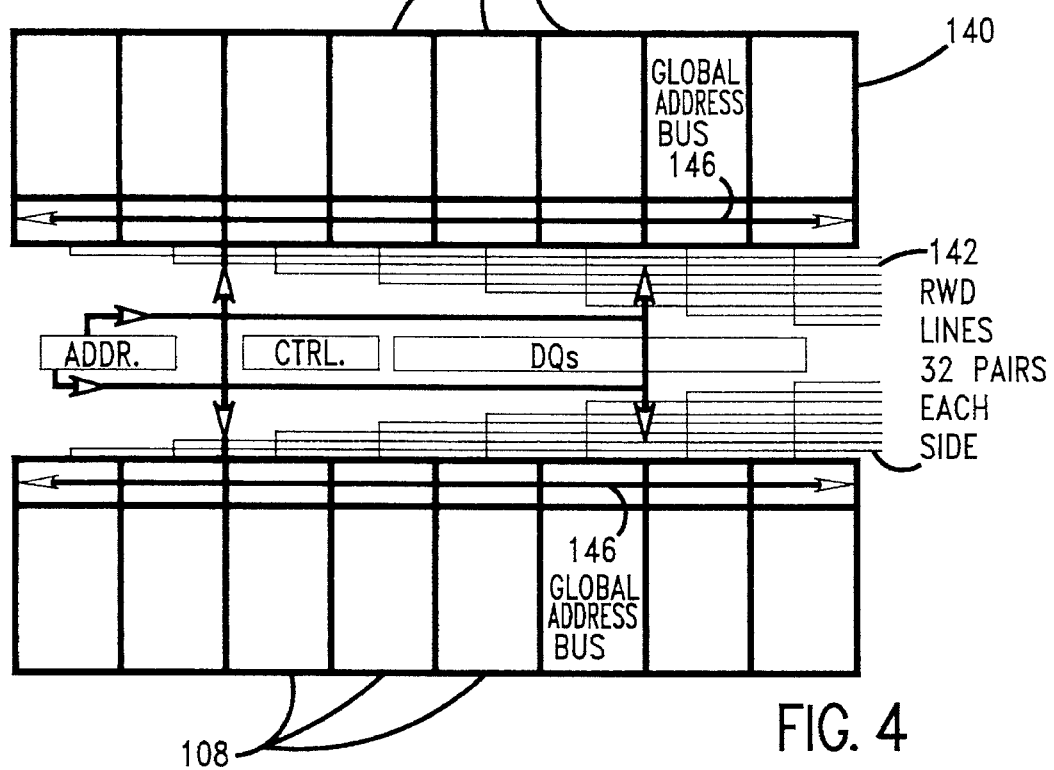
FIG. 4 is a schematic representation of a DRAM chip 140 including an alternate embodiment, wherein the RWD lines 142 are concentrated in one end.

FIG. 4 is a schematic representation of a DRAM chip 140 including an alternate embodiment, wherein the RWD lines 142 are concentrated in one end. With a ×32 organization, it is possible to have 16 open channels between the address pads and the quarter points on the array. However, in this embodiment, the total bus area increases because 16 more pairs of RWD lines 142 are required over the embodiment of FIG. 3.

Figure 5A:
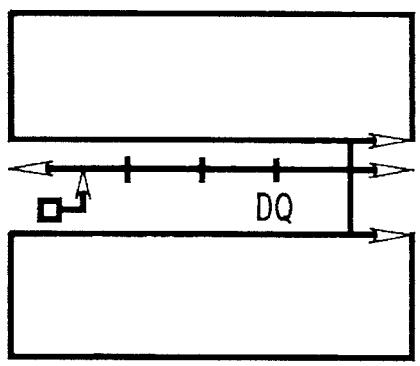
FIG. 5A–E compare the split bus arrangement of the present invention with the prior art schemes.
Figure 5B:
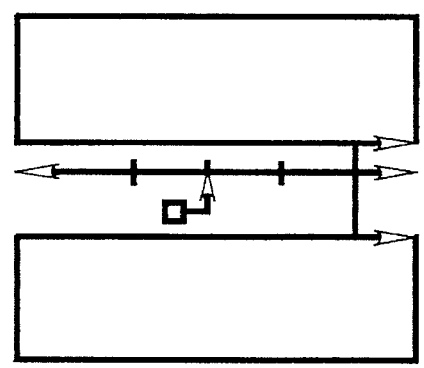
Figure 5C:
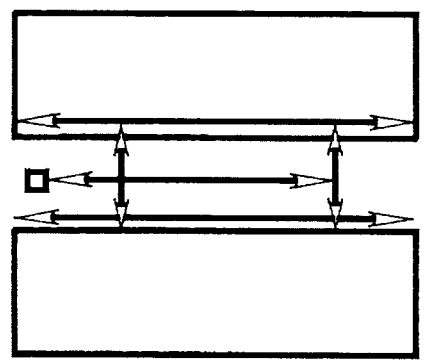
Figure 5D:
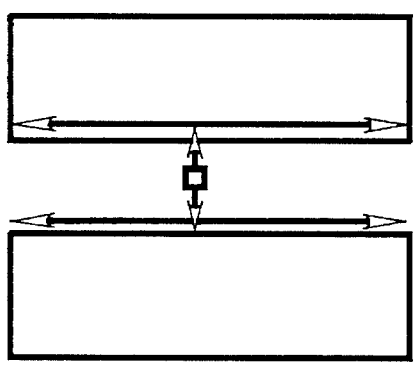
Figure 5E:
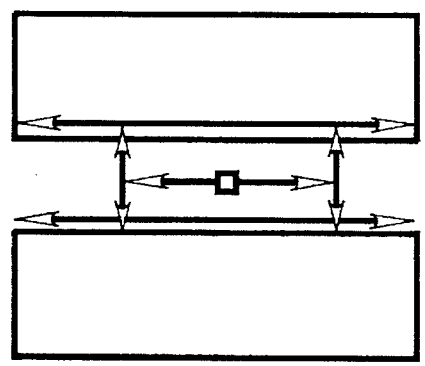

FIG. 5A–E compare the split bus arrangement of the present invention with the prior art schemes. FIG. 5A represents a prior art single global bus with edge DQs, wherein R=510Ω, C=5pF and the number of driven stages is 6. FIG. 5B represents a prior art single global bus with both end DQs, wherein R=290Ω, C=3pF and the number of driven stages is 5. FIG. 5C represents an alternate embodiment split global bus of FIG. 4 with center local bus and edge DQs (twice as many DQs are required for this embodiment as for the preferred embodiment), wherein R=150Ω, C=3.75pF and the number of driven stages is 6. FIG. 5D represents an alternate embodiment split global bus without a center local bus and with both end DQs, wherein R=290Ω, C=7.5pF and the number of driven stages is 4. FIG. 5E represents the preferred embodiment split global bus of FIG. 3 with a center local bus and both end edge DQs, wherein R=150Ω, C=3.75pF and the number of driven stages is 6.

Table I is a comparison of the performance (0.5RC+driver delays, skew) and the relative areas of the various bus schemes in FIG. 5A–E. The calculated delay is from the DQ to the end of redundancy local bus. As can be seen from Table I, the preferred embodiment split bus of FIG. 5E provides a 1.5× reduction in global bus area over prior art arrangements and is easier to layout. It is also clear that the addition of the local bus and redrive drastically reduces delay and skew.

TABLE I

| Scheme | Figure | Bus area (relative) | Δ Delay (ns) | Skew (ns) |
| --- | --- | --- | --- | --- |
| Single bus + Edge DQ | 5(a) | ~1.5x | +1.0 | 1.3 |
| Single bus + Both-end DQ | 5(b) | ~1.5x | +0.2 | 0.5 |
| Split bus + Edge DQ + Center local bus | 5(c) | 1x | +0 | 0.3 |
| Split bus + Both-end DQ + w/o local bus | 5(d) | 1x | +0.2 | 1.1 |
| Split bus + Both-end DQ + Center local bus (This invention) | 5(e) | 1x | +0 | 0.3 |

We claim:

1. A Random Access Memory (RAM) comprising:

a memory array, said memory array being divided into two halves, each said half including a plurality of memory units, each said unit including a plurality of memory cells;

each said half having a global bus along one side;

a pair of Data I/O banks (DQ), said pair of DQs being located at opposite ends of said RAM between said global busses; and, a local bus between said global busses.

2. The RAM of claim 1 wherein each of said memory units includes redundant memory.

3. The RAM of claim 1 further comprising Read Write Data lines (RWD) between said memory units and said DQs, said RWDs being denser at opposite ends than at the center of said RAM.

4. The RAM of claim 3 further comprising redrive circuits between said each global bus and said local busses.

5. The RAM of claim 4 wherein said local bus is between said RWDs.

6. The RAM of claim 5 wherein each of said memory units includes redundant memory.

7. The RAM of claim 1 further comprising Read Write Data lines (RWD) between said memory units and said DQs, said RWDs being at one end of said RAM, between said global busses.

8. The RAM of claim 7 wherein the Read Write Data lines (RWD) are denser at opposite ends than at the center of said RAM.

9. The RAM of claim 8 further comprising redrive circuits between said each global bus and said local busses.

10. The RAM of claim 9 wherein said local bus is between said RWDs.

11. The RAM of claim 10 wherein each of said memory units includes redundant memory.

* * * * *